United States Patent
Aiken

(10) Patent No.: US 9,435,665 B2
(45) Date of Patent: Sep. 6, 2016

(54) SYSTEM AND METHOD FOR TAMPER DETECTION IN A UTILITY METER

(71) Applicant: Aclara Meters LLC, Hazelwood, MO (US)

(72) Inventor: Brian Matthew Aiken, Boulder, CO (US)

(73) Assignee: Aclara Meters LLC, Hazelwood, MO (US)

( * ) Notice: Subject to any disclaimer, the term of this patent is extended or adjusted under 35 U.S.C. 154(b) by 0 days.

(21) Appl. No.: 14/175,833

(22) Filed: Feb. 7, 2014

(65) Prior Publication Data

US 2015/0226583 A1    Aug. 13, 2015

(51) Int. Cl.
| | |
|---|---|
| *G01B 11/00* | (2006.01) |
| *G01D 5/28* | (2006.01) |
| *G01R 11/24* | (2006.01) |
| *G01R 11/25* | (2006.01) |
| *G01F 15/00* | (2006.01) |
| *G01D 5/26* | (2006.01) |

(52) U.S. Cl.
CPC ............... *G01D 5/28* (2013.01); *G01D 5/264* (2013.01); *G01F 15/007* (2013.01); *G01R 11/24* (2013.01); *G01R 11/25* (2013.01)

(58) Field of Classification Search
CPC ...... G01N 21/00; G01B 11/00; G02B 27/00; G02B 5/00; G01S 17/00
USPC ................ 356/399–401, 136, 139, 153, 128; 250/577, 559.3
See application file for complete search history.

(56) References Cited

U.S. PATENT DOCUMENTS

| | | | |
|---|---|---|---|
| 4,751,396 A | 6/1988 | Daigle et al. | |
| 5,399,876 A * | 3/1995 | LaClair | 250/577 |
| 5,534,708 A * | 7/1996 | Ellinger et al. | 250/577 |
| 5,880,480 A * | 3/1999 | Ellinger et al. | 250/577 |
| 6,038,050 A * | 3/2000 | Hamar | 359/196.1 |
| 6,515,294 B1 * | 2/2003 | Busch et al. | 250/559.3 |
| 6,714,131 B2 | 3/2004 | Iwasawa et al. | |
| 7,786,457 B2 * | 8/2010 | Gao | A61B 19/0248 128/867 |
| 7,834,309 B2 | 11/2010 | Anderson et al. | |
| 8,203,448 B2 * | 6/2012 | Chien | G07D 11/0042 194/203 |
| 8,319,638 B2 | 11/2012 | Smith | |
| 2012/0130681 A1 | 5/2012 | Pride | |
| 2013/0076340 A1 | 3/2013 | Rauoud et al. | |

* cited by examiner

*Primary Examiner* — Tarifur Chowdhury
*Assistant Examiner* — Isiaka Akanbi
(74) *Attorney, Agent, or Firm* — Polster, Lieder, Woodruff & Lucchesi, LC

(57) ABSTRACT

A tamper detection system for a utility meter includes an emitter configured to emit light and a detector configured to receive light. The tamper detection system also includes a light modifying feature coupled to an interior surface of a meter cover. An end portion of the light modifying feature is configured to be positioned proximate to the emitter and the detector while the meter cover is in a closed position relative to the utility meter. The light modifying feature is also configured to alter a direction of travel of the emitted light and to direct the emitted light toward the detector while the meter cover is in the closed position relative to the utility meter.

15 Claims, 11 Drawing Sheets

SYSTEM AND METHOD FOR TAMPER DETECTION IN A UTILITY METER

BACKGROUND

The subject matter disclosed herein relates to tamper detection in a utility meter.

Utility meters that measure utility consumption may enable a utility provider, such as an electricity provider, to monitor a consumer's use of the utility. In some instances, utility meters are read manually, which can be costly, inefficient, and subject to errors. In some instances, utility providers may remotely monitor utility meters via a communications network. In such cases, a technician of the utility provider may physically access the utility meter to perform maintenance on the meter or to make adjustments to one or more operational parameters of the utility meter, for example. Thus, the utility meter may include a removable cover to facilitate physical access to the utility meter. Unfortunately, in certain situations, an unauthorized person may attempt to remove the cover to physically access the utility meter, in an attempt to alter utility consumption data or to restore the utility to a residence that has not paid for the utility, for example. Accordingly, certain utility meters may be subject to tampering or unauthorized use.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a utility meter includes a main body supporting metering circuitry configured to monitor consumption of a utility, an emitter configured to emit one or more wavelengths of light, and a detector configured to receive light and to generate a signal indicative of light received at the detector. The utility meter also includes a meter cover configured to be positioned relative to the main body. The meter cover includes a light modifying feature coupled to an interior surface of the meter cover. The light modifying feature is configured to alter an orientation of the emitted light and to direct the emitted light toward the detector while the meter cover is in a closed position relative to the main body. The utility meter also includes a processor configured to determine whether the meter cover is in the closed position or an open position based on the signal generated by the detector.

In one embodiment, a system includes a tamper detection system for a utility meter. The tamper detection system includes an emitter configured to emit light and a detector configured to receive light. The tamper detection system also includes a light modifying feature configured to help direct the light along a path from the emitter to the detector while a meter cover is in a closed position relative to the utility meter, wherein the path is broken when the meter cover is in an open position relative to the utility meter.

In one embodiment, a method for detecting tampering of a utility meter includes the steps of emitting light via an emitter coupled to the utility meter and altering an orientation of the light emitted by the emitter to direct the light toward a detector coupled to the utility meter via a light modifying feature coupled to a cover of the utility meter while the cover is in a closed position relative to the utility meter. The method also includes, using a processor of the utility meter, monitoring an intensity of the light received at the detector of the utility meter, comparing the intensity of the light received at the detector to a predetermined threshold intensity, and identifying a tampering event of the utility meter when the intensity of the light received at the detector is below the predetermined threshold.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
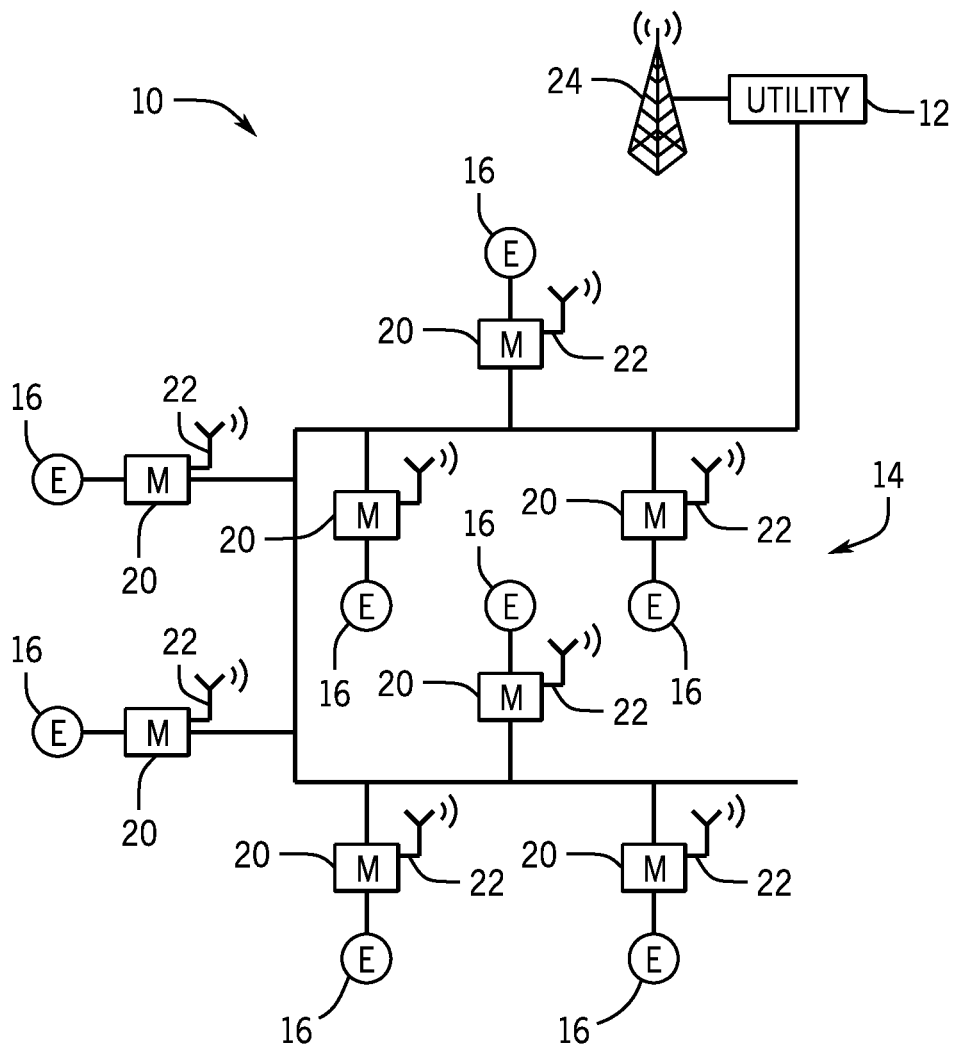
FIG. 1 is a block diagram of an embodiment of an electrical system having energy meters configured to monitor power consumption and to detect tampering events.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Certain utility meters may be subject to tampering by removing a cover of the utility meter to access control elements of the utility meter. Utility meters include energy meters, water meters, and sewage meters. Energy meters may include electric meters and gas meters, such as natural gas meters. Furthermore, the utility meters may include smart utility meters, as discussed below. The following discussion focuses on energy meters, such as an electric meter, as an example that may benefit from the disclosed tamper detection system, although the tamper detection system may be used in any of the utility meters. As noted above, an unauthorized user may remove the cover of an energy meter and attempt to restore electricity or change utility consumption data by manipulating certain control elements of the energy meter. Accordingly, disclosed herein are systems and methods configured to detect removal of the cover of the utility meter to detect a tampering event.

The disclosed embodiments utilize optical techniques to detect removal of the cover, which may be a clear (e.g., transparent) cover, relative to the utility meter. Removal of the cover of the utility meter may be indicative of a tampering event. Without the disclosed embodiments, techniques for detecting cover removal and tampering events of utility meters may utilize switches or opaque, reflective components that are coupled to the transparent cover of the utility meter. Such techniques require physical contact between various parts (e.g., between the switch and meter circuitry or between the cover and the opaque components), and thus, are subject to damage during transport, drops, or other mechanical forces. Additionally, such techniques may block visibility of certain internal portions of the utility meter, may require additional parts, may have a more complex structure, and/or may have higher costs as compared with the embodiments disclosed herein.

With the foregoing in mind, the present embodiments may include optical components (e.g., an emitter and a detector) positioned within the utility meter to facilitate detection of the tampering event. The emitter may be configured to emit one or more wavelengths of light and the detector may be configured to detect light. Light received at the detector may be monitored to determine whether the cover is suitably positioned on the utility meter. The cover of the utility meter may include a light modifying feature that is configured to direct the emitted light toward the detector while the cover is in a closed position (e.g., an on position) relative to the utility meter. For example, the light modifying feature may be a prism configured to reflect light toward the detector or a lens configured to focus light toward the detector. Therefore, while the emitted light is received at the detector, a processor associated with the utility meter may determine that the cover is in the closed position and is suitably positioned on the utility meter. However, while the emitted light is not received at the detector, or while an intensity of the light received at the detector is below a predetermined threshold intensity, the processor may determine that that the cover is in an open position (e.g., an off position) or is not suitably positioned on the utility meter, and therefore, that the tampering event has occurred. Upon determining that the tampering event has occurred, the processor may record the potential tampering event locally at the utility meter (e.g., in a nonvolatile memory) and/or may notify a utility provider (e.g., via a communications network) of the tampering event to enable the utility provider to take an appropriate action, for example.

It should be noted that while the disclosed embodiments are discussed in the context of energy meters configured to detect tampering events, that other types of utilities are also presently contemplated. For example, as mentioned above, utility meters in accordance with the disclosed embodiments may monitor any one or a combination of electricity, heat, gas, water, or any other utility. Therefore, while the disclosed embodiments are presented in the context of tamper-detecting energy meters, other tamper-detecting utility meters, such as tamper-detecting heat meters, tamper-detecting gas meters, tamper-detecting water meters, or a combination thereof, are presently contemplated. Furthermore, energy meters, as presently discussed, may include gas meters, electricity meters, or a combination thereof.

With the foregoing in mind, FIG. 1 illustrates a block diagram of an electrical system 10 including a power utility 12 that supplies power to a power grid 14. Loads on the power grid 14 may include, for example, residential and/or commercial establishments 16. Tamper-detecting energy meters 20 may monitor the power consumption by the establishments 16. As mentioned above and described in greater detail below, the tamper-detecting energy meters 20 are configured to detect the removal of their respective covers to facilitate identification of tampering events.

In a normal operational state, the tamper-detecting energy meters 20 may monitor power consumed by the establishment 16 to which they are affixed. Additionally, the tamper-detecting energy meters 20 may communicate with the power utility 12 via data communication links 22, which may be part of a communications network. Such data communication links 22 may be wired (e.g., over wired telecommunication infrastructure) or wireless (e.g., a cellular network or other wireless broadband, such as WiMax). Similarly, the power utility 12 may employ a communication link 24 configured to communicate with the various tamper-detecting energy meters 20. For example, the tamper-detecting energy meters 20 may communicate data indicative of tampering events via the communication links 22.

As discussed in more detail below, the tamper-detecting energy meters 20 may also be configured to detect tampering events in low power states, such as when electricity is not being provided to one or more of the establishments 16 due to non-payment, a natural occurrence such as weather or seismic activity, or during manufacturing and transport of the tamper-detecting energy meters 20 to the one or more establishments 16. For example, in accordance with certain embodiments, the tamper-detecting energy meters 20 may utilize any suitable source of power, such as solar power or battery power (i.e., electrical energy from an energy storage unit or battery) to maintain operation of certain components in a low power state (i.e., a no power state or base power state) of the tamper-detecting energy meters 20.

Figure 2:
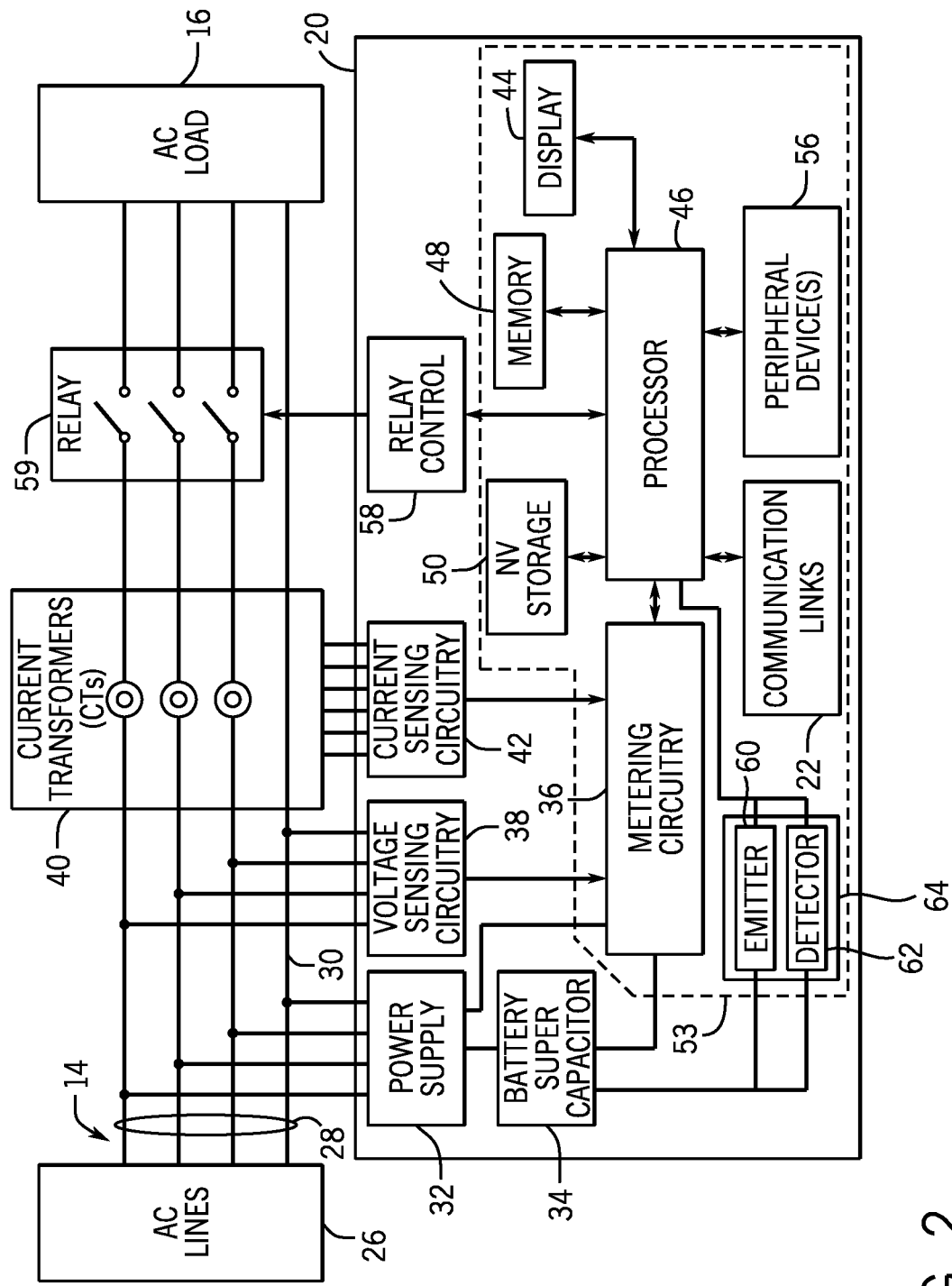
FIG. 2 is a block diagram of an embodiment of an energy meter configured to detect tampering events.

The tamper-detecting energy meters 20 may take any of a variety of forms. One embodiment of the tamper-detecting energy meter 20 is illustrated in FIG. 2. As shown, the tamper-detecting energy meter 20 is joined to the power grid 14. Power flows from AC lines 26 to the one or more establishments 16 (e.g., an AC load). In the illustrated embodiment, the AC lines 26 may transmit power via one or more phase lines 28 and a neutral line 30. The tamper-detecting energy meter 20 may obtain power via power supply circuitry 32 that may be coupled to the one or more phase lines 28 and the neutral line 30 for the tamper-detecting energy meter's 20 internal power consumption. To backup power consumption data in the event of a power outage, for example, the power supply circuitry 32 may also charge a battery and/or super capacitor 34 (i.e., an energy storage unit). In alternative embodiments, the backup power may be fed by a non-rechargeable battery. The battery/super capacitor 34 may also enable tamper detection in low power states by providing electrical energy to various elements of the tamper-detecting energy meter 20, as discussed in detail below.

Metering circuitry 36 may ascertain power consumption by monitoring the voltage and current traversing the AC lines 26 to the one or more establishments 16. Current transformers (CTs) 40 and current sensing circuitry 42 may determine the current flowing through the one or more phase lines 28. In some embodiments, the metering circuitry 36 may output the current power consumption values to an electronic display 44, such as a liquid crystal display (LCD), and/or to a processor 46. The metering circuitry 36 may sense the voltage and current inputs and send corresponding pulses to the processor 46, which calculates data, such as the energy accumulation, power factor, active power, reactive power, maximum demand, and the like. The data may be stored in a memory 48 and/or a nonvolatile storage 50.

In some embodiments, the processor 46 may also be configured to detect tampering events and/or to determine information related to the tampering events. Such information may be stored in the memory and/or the nonvolatile storage 50. For example, a time and/or date in which the cover of the tamper-detecting energy meter 20 has been removed may be recorded and stored. As discussed below, a signal indicative of the tampering event and/or the information pertaining to the tampering event may be transmitted to the utility provider via the communications link 22, for example. The information may include, by way of non-limiting examples, a time and/or date of the tampering event, identification data of the tamper-detecting energy meter 20, an identifier of a customer, GPS data, or any combination thereof. Although the processor 46 of the tamper-detecting energy meter 20 may determine or identify tampering event, it should be understood that a separate processing unit (e.g., part of a separate monitoring or computer system) may be utilized to determine or identify the tampering event. For example, signals or the information may be provided to the separate processing unit via the communications link 22, for example, and the separate processing unit may process and/or analyze the signals to identify the tampering event. The separate processing unit may have processing features similar to those discussed with respect to the processor 46.

The processor 46 may include one or more microprocessors, such as one or more "general-purpose" microprocessors, one or more application-specific processors (ASICs), a field programmable array (FPA) or a combination of such processing components, which may control the general operation of the tamper-detecting energy meter 20. For example, the processor 46 may include one or more instruction set processors (e.g., RISC) and/or other related chipsets. The memory 48 and/or the nonvolatile storage 50 may store the current and/or certain historical power consumption values, as well as provide instructions to enable the processor 46 to detect or determine occurrence of tampering events, determine information related to the tampering events, and to take certain actions based on the determination.

Programs or instructions executed by the processor 46 to detect tampering events may be stored in any suitable component that includes one or more non-transitory, tangible, computer-readable media at least collectively storing the executed instructions or routines, such as, but not limited to, the memory devices and storage devices described below. Also, these programs encoded on such a computer program product may also include instructions that may be executed by the processor 46 to enable the tamper-detecting energy meter 20 to provide various functionalities, such as communication with the utility provider 12 and/or a visual indication of the tampering event on the display 44.

For example, instructions or data to be processed by the processor 46 may be stored in the memory 48, which may include a volatile memory, such as random access memory (RAM); a non-volatile memory, such as read-only memory (ROM); or a combination of RAM and ROM devices, or may be stored internal to the processor 46 and/or metering circuitry 36. The memory 48 may store firmware for the tamper-detecting energy meter 20, such as a basic input/output system (BIOS), an operating system, various programs, applications, or any other routines that may be executed on the tamper-detecting energy meter 20, including user interface functions, processor functions, communication functions, image acquisition functions, audio alteration functions, media playback functions, and so forth. The memory 48 may be optional if the processor 46 is capable of storing such information and/or firmware in its internal memory. As noted above, information pertaining to the tampering event, the tamper-detecting energy meter 20, the customer, or any combination thereof, may also be provided to the utility provider.

As mentioned above, the tamper-detecting energy meter 20 may communicate with the power utility 12 to provide various data and information, including information related to tampering events. Such communication may take place via the one or more communication links 22, which may include interfaces for a personal area network (PAN), such as a Bluetooth network, a local area network (LAN), such as an 802.11x Wi-Fi network, a wide area network (WAN), such as a 3G or 4G cellular network (e.g., WiMax), an infrared (IR) communication link, a Universal Serial Bus (USB) port, and/or a power line data transmission network such as Power Line Communication (PLC) or Power Line Carrier Communication (PLCC). Additionally, the tamper-detecting energy meter 20 may connect to various peripheral devices 56, such as computing devices (e.g., computers or portable phones) or input devices (e.g., a keyboard).

In certain embodiments, the power utility 12 may communicate with the tamper-detecting energy meter 20 to remotely control the flow of power to the one or more establishments 16. Based on instructions received from the power utility 12 via the communication links 22, the processor 46 may correspondingly instruct relay control circuitry 58 to open or close a relay 59. For example, if the consumer has not paid for the power being received, the relay 59 may be opened, disconnecting the one or more establishments 16 from the AC lines 26.

The nonvolatile storage 50 may be utilized for persistent storage of data and/or instructions relating to tamper detection. The nonvolatile storage 50 may include flash memory, a hard drive, or any other optical, magnetic, and/or solid-state storage media. By way of non-limiting examples, the nonvolatile storage 50 may be used to store data files, such as historical power consumption as determined by the metering circuitry 36, as well as indications of consumer account balance information, dynamic power prices, tampering events, and/or abnormal activity on the power grid 14 as communicated to the tamper-detect energy meter 20 by the power utility 12. For example, in certain embodiments, the nonvolatile storage 50 may store times and/or dates of tampering events.

As shown, the tamper-detecting energy meter 20 includes an emitter 60 and a detector 62 communicatively coupled with the processor 46. The emitter 60 may be configured to emit one or more wavelengths of light, and the detector 62 may be configured to detect one or more wavelengths of light. In some embodiments, the emitter 62 may be a light emitting diode (LED) configured to emit any suitable wavelength of light, such as one or more wavelengths of infrared (IR) light. For example, in some embodiments, the emitter 60 may be configured to emit light between approximately 700 nm to 990 nm, between approximately 750 nm to 900 nm, or between approximately 800 nm to 850 nm. In some embodiments, the emitter 62 may be configured to emit light continuously. In certain embodiments, the emitter 62 may be configured to emit light periodically (e.g., at predetermined intervals, such as about every 1 minute, 5 minutes, 15 minutes, 60 minutes, or longer). Any suitable detector 62 may be provided, and in some embodiments, the detector 62 is a photodiode. In some embodiments, the detector 62 may be tuned to detect the one or more wavelengths of light emitted by the emitter 62, and thus, may be configured to block detection of ambient light.

In some embodiments, the emitter 60 and/or the detector 62 may be coupled to and/or integrated into a circuit board 53 (e.g., a main meter assembly circuit board) that supports the processor 46, the display 44, and/or other elements of the tamper-detecting energy meter 20, such as the metering circuitry 36, the NV storage 50, the memory 48, one or more communication devices 54, various peripheral devices 56, or any combination thereof, for example. In such cases, the emitter 60 and/or the detector 62 may be positioned a suitable distance from reflective surfaces of the tamper-detecting utility meter 20 (e.g., opaque or reflective walls or the like). For example, the emitter 60 and/or the detector 62 may be positioned at least approximately 2 millimeters (mm) to 7 mm away from reflective surfaces of the tamper-detecting utility meter 20.

Together, the emitter 60 and the detector 62 may form or be part of a tamper-detecting sensor 64. The processor 46 may be configured to detect tampering events based on whether the light emitted by the emitter 60 is received at the detector 62, which in turn may be an indication of whether the cover of the tamper-detecting energy meter 20 is in a closed position or an open position, as discussed in more detail below. In some embodiments, an intensity of light received at the detector 62 may be monitored, such as by the processor 46. In such cases, the processor 46 may be configured to detect tampering events when a change in the intensity of the light received at the detector 62 exceeds a predetermined threshold percentage and/or when the intensity of the light received at the detector decreases below a predetermined threshold intensity.

Figure 3:
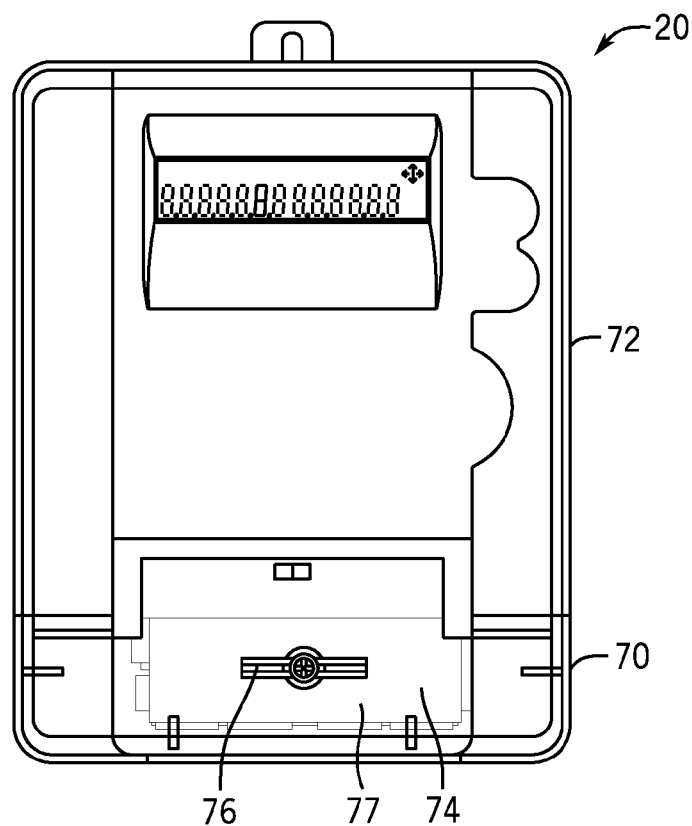
FIG. 3 is a front view of an embodiment of the energy meter of FIG. 2.

FIG. 3 is a front view of an embodiment of the tamper-detecting energy meter 20, hereinafter "meter," having a cover 70 and a main body 72. As shown, at least a portion of a top wall 74 (e.g., a front wall) of the cover 70 is substantially transparent to facilitate viewing various internal components of the meter 20, although in some embodiments, all of the cover 70 is transparent. The meter 20 may have a generally rectangular geometry, although the meter 20, the main body 72, and/or the cover 70 may have any suitable shape or geometry, such as square, rectangular, triangular, circular, semi-circular, or elliptical.

As shown, the cover 70 includes a cover fastener 76, which is configured to couple the cover 70 to the main body 72. While any cover fastener 76 is presently contemplated, by way of non-limiting examples, the cover fastener 76 may couple the cover 70 to the main body 72 via a threaded fastener (e.g., a bolt or a screw), teeth, an interference fit, a friction fit, a snap fit (e.g., a tapered lip that engages a recess or an opening), a clamp, or any combination thereof. In the illustrated embodiment, the cover fastener 76 is positioned proximate to and is accessible at an exterior surface 77 of the top wall 74, and the cover fastener 76 is a rotatable coupling using threads and/or an interference or friction fit, to provide resistance to removal of the cover 70 from the main body 72. Providing such resistance may be desirable to control the ease and speed with which a person may remove the cover 70 from the main body 72.

Figure 4:
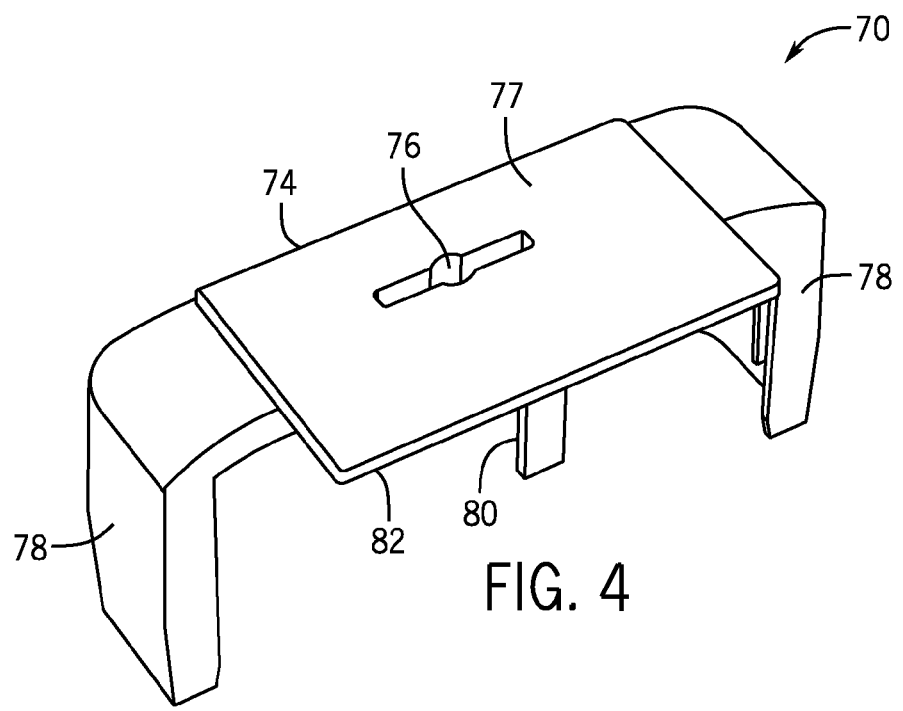
FIG. 4 is a perspective view of an embodiment of a cover that may be used with the energy meter of FIG. 2.

FIG. 4 is a perspective view of the cover 70 that may be utilized with the meter 20 of FIG. 2. In the illustrated embodiment, the cover 70 includes the top wall 74, which extends between opposed side walls 78 of the cover 70. The cover 70 also includes a light modifying feature 80 to enable tamper detection as discussed in further detail below. The light modifying feature 80 may be part of or may form the tamper-detecting sensor 64, together with the emitter 60 and the detector 62. The light modifying feature 80 may extend (e.g., protrude) from an interior surface 82 of the top wall 76 and may be positioned between the opposing side walls 78. In certain embodiments, the light modifying feature 80 may extend orthogonally from the top wall 70 and/or may be substantially parallel to the opposing side walls 78.

In certain embodiments, the light modifying feature 80 may be integrally, gaplessly, and/or continuously formed with the cover 70. In certain embodiments, the cover 70 and the light modifying feature 80 may be formed from a single, homogenous material (e.g., a one piece structure). For example, the cover 70 having the light modifying feature 80 may be formed by molding the single, homogenous material into the desired configuration. Thus, in some embodiments, the light modifying feature 80 is not physically-separate from the cover 70. In some embodiments, the cover 70 and the light modifying feature 80 may have the same optical properties. For example, in certain embodiments, some or all of the cover 70 and/or some or all of the light modifying feature 80 may be transparent. The meter 20 in accordance with the present disclosure may therefore be configured to detect tampering events and may also have a generally low cost, simple, and/or sturdy configuration.

Figure 5:
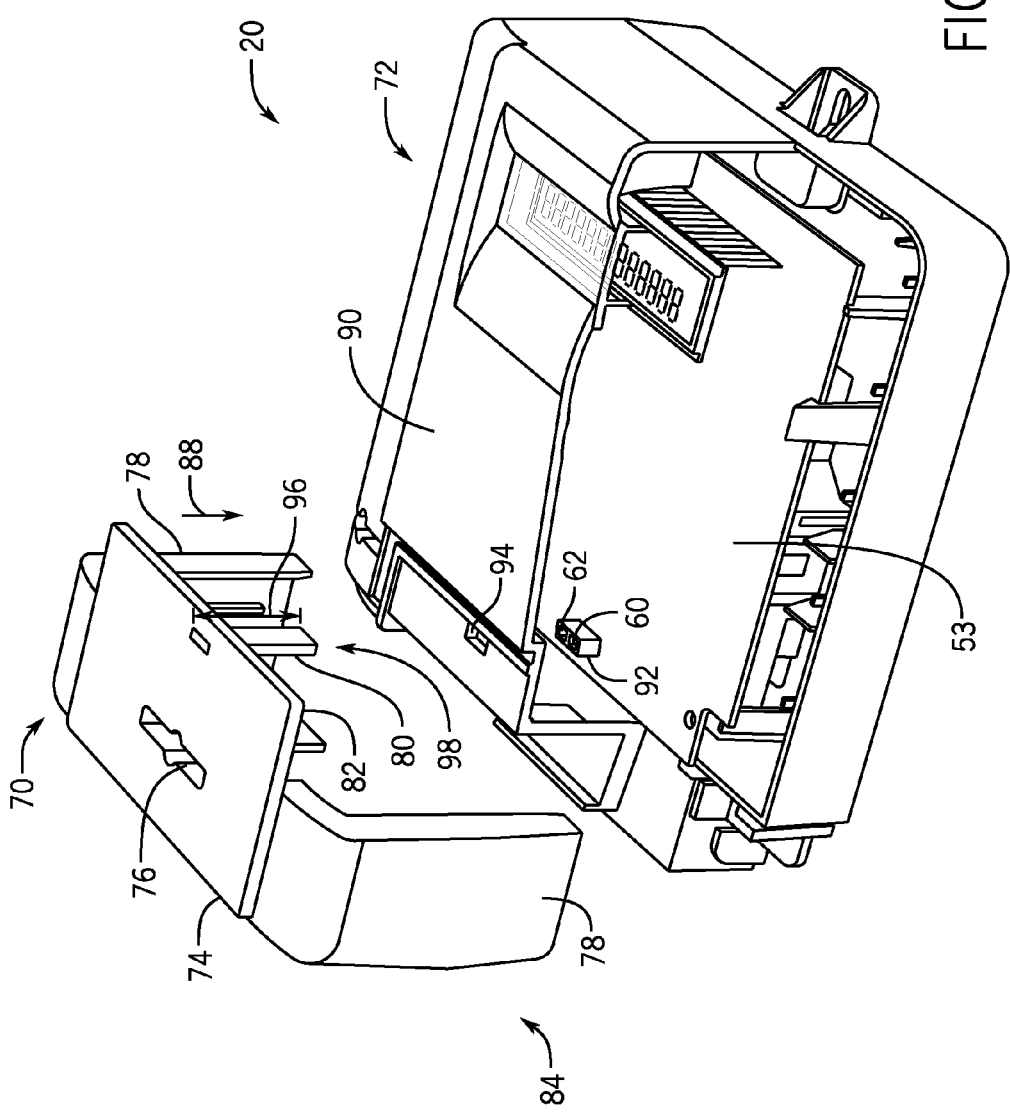
FIG. 5 is an exploded perspective view of an embodiment of an energy meter including optical components and a cover having a light modifying feature configured to alter an orientation of light by 180 degrees to facilitate detection of tampering events.

FIG. 5 is an exploded perspective view of an embodiment of the meter 20 including optical components and the cover 70 having the light modifying feature 80 configured to alter an orientation of light by 180 degrees to facilitate detection of tampering events. As shown, the cover 70 is in an open position 84, and the cover 70 is configured to be mounted to the main body 72 in a direction of arrow 88. As noted above, it should be understood that in other embodiments, the cover 70 and/or the main body 72 may have any suitable shape, geometry, and/or configuration. For example, in some embodiments, the cover 70 may be rotated and/or pivoted with respect to the main body 72 to apply the cover 70 to the main body 72. In some such configurations, the cover 70 may be rotated about a central axis of the meter 20 or about a hinge of the meter 20, for example.

As shown, the main body 72 includes a faceplate 90 that is configured to protect certain components of the meter 20, such as the circuit board 53. The faceplate 90 may be opaque to block visualization of certain components of the meter 20. In some embodiments, the emitter 60 and the detector 62 may be coupled to the circuit board 53 in any suitable manner, and thus may also be protected by the faceplate 90. In the illustrated embodiment, the emitter 60 and the detector 62 are positioned within a housing 92 that is coupled to (e.g., mounted on) the circuit board 53.

The main body 72 and the cover 70 may be configured to facilitate alignment of the light modifying feature 80 with the emitter 60 and the detector 62 when the cover 70 is applied to the main body 72. For example, one or more alignment guides (e.g., protrusions and corresponding slots) may be provided on the main body 72 and/or the cover 70. By way of another example, the faceplate 90 of the main body 72 may include an opening 94 configured to receive the light modifying feature 80 of the cover 70. In such cases, when the cover 70 is applied to the main body 72, the light modifying feature 80 extends through the opening 94 and is aligned with and positioned proximate to the emitter 60 and the detector 62. The light modifying feature 80 may have any suitable horizontal cross-sectional shape, such as rectangular or triangular, for example. The light modifying feature 80 may have a uniform horizontal cross-sectional shape along a length 96 of the light modifying feature 80. As discussed in more detail below, an end portion 98 of the light modifying feature 80 may include structural elements, such as one or more reflective surfaces or angled surfaces, to modify an orientation of light.

Figure 6:
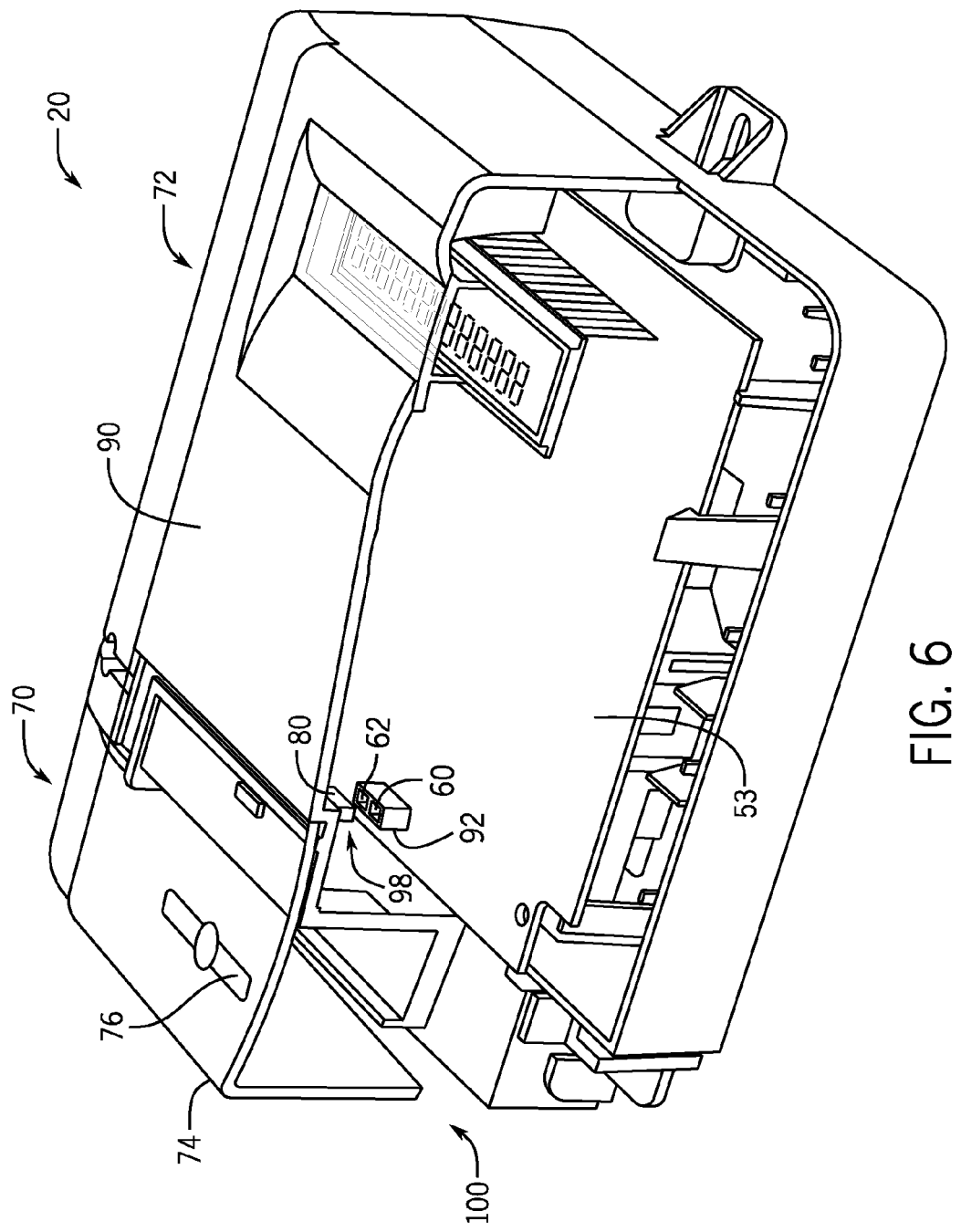
FIG. 6 is a partial cutaway perspective view of an embodiment of the energy meter of FIG. 5 with the cover in a closed position and the light modifying feature positioned proximate to the optical components.

FIG. 6 is a partial cutaway perspective view of an embodiment of the meter 20 of FIG. 5 with the cover 70 in a closed position 100 and having the end portion 98 of the light modifying feature 80 positioned proximate to the emitter 60 and the detector 62. While the cover 70 is in the closed position 100, the light emitted by the emitter 60 contacts the light modifying feature 80. In the depicted embodiment, the light modifying feature 80 includes structural elements configured to alter the orientation of emitted light by approximately 180 degrees. For example, the structural elements may include diverging reflective surfaces (e.g., a v-shape structure or a diverging structure), as described in more detail below. Thus, while the cover is in the closed position 100, the emitted light is reflected by the light modifying feature 80 toward the detector 62 that is adjacent to the emitter 60.

Figure 7:
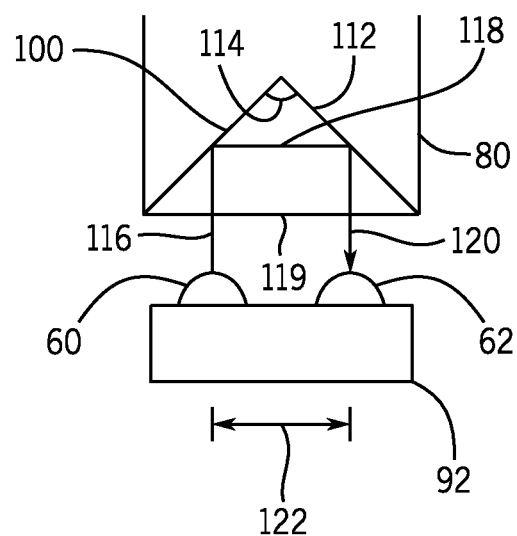
FIG. 7 is a schematic side view of a portion of the energy meter of FIG. 5 with the cover in the closed position and the light modifying feature positioned proximate to the optical components.

FIG. 7 is a schematic side view of a portion of the meter 20 of FIGS. 5 and 6 with the cover 70 in the closed position 100. As shown, the light modifying feature 80 reflects the light emitted by the emitter 60 toward the detector 62, while the cover 70 is in the closed position 100. In the depicted embodiment, the emitter 60 and the detector 62 are positioned side-by-side or adjacent to each other. Additionally, the light modifying feature 80 is a light reflecting feature (e.g., a prism or porro prism) having two reflecting faces 110, 112 (e.g. diverging reflecting surfaces or diverging reflectors) positioned at an angle 114 (e.g., 90 degrees) relative to each other. Light emitted by the emitter 60 travels along a first path 116 and contacts the first reflecting face 110. The light is reflected from the first reflecting face 110 along a second path 118 toward the second reflecting face 112. The second reflecting face 112 reflects the light along a third path 120, parallel to the first path 114, toward the detector 62. In some embodiments, the light modifying feature 80 includes a bottom surface 119 positioned orthogonally with respect to the first path 116 and the second path 118, such that the light is not dispersed or altered by passing through the bottom surface 119. The emitted light may be totally internally reflected by the first and second reflective faces 110, 112 of the light modifying feature 80. The light modifying feature 80 may reflect the light through a total angle of 180 degrees, and the light reflected toward the detector 62 may be offset from the light emitted by the emitter 62 by a distance 122. Thus, the detector 62 may be positioned adjacent to the emitter 60 at the distance 122 from the emitter 60, as shown, and may detect the emitted light due to reflection of the light by the light modifying feature 80 while the cover 70 is in the closed position 100. In other embodiments, the first and second reflective faces 110, 112 of the light modifying feature 80 may be configured to reflect the light through any suitable total angle (e.g., 60 to 120 degrees, 70 to 110 degrees, or 80 to 100 degrees) and the emitter 60 and the detector 62 may be positioned in appropriate positions to enable emission and detecting of the light for tamper detection, as disclosed herein.

However, while the cover 70 is not in the closed position 100 (e.g., the cover 70 is removed from the meter 20), the light modifying feature 80 is not positioned proximate to the emitter 60 and the detector 62. Thus, if the cover 70 is not in the closed position 100, light emitted by the emitter 60 travels along the first path 116 and is not reflected by the reflective faces 110, 112 toward the detector 62. The processor 46 may be configured to determine that the cover 70 has been removed from the meter 20 and that a tampering event has occurred based whether light is received at the detector 62. In some embodiments, an intensity of the light received at the detector 62 may be monitored. In such cases, the processor 46 may be configured to determine that the tampering event has occurred when the intensity of the light received at the detector 62 is below a predetermined threshold intensity. When the tampering event is detected, the processor 46 may record the tampering event and/or may communicate the tampering event to a utility provider, as discussed above. In certain embodiments, other control actions may be taken, such as locking out the meter 20, terminating service of the utility, or the like.

As noted above, in some circumstances, it may be desirable for the meter 20 to continue to be able to detect tampering events even when power is not being provided to the one or more establishments 16 (e.g., due to a power outage). In such cases, the meter 20 may not be able to draw power from an external source, such as the AC lines 26 (FIG. 2), and may be powered by any suitable source such as solar power and/or the battery/super capacitor 34 (FIG. 2). The meter 20 may be configured to draw power from the battery/super capacitor 34 only for certain processes, such as intermittent communications, maintaining the data stored within the nonvolatile storage 50, the memory 48, and/or the processor 46, and/or detecting tampering events. In some embodiments, the meter 20 may be configured to adjust a frequency with which the emitter 60 emits light when the meter 20 is operating only with solar power or power from the battery/super capacitor 24 (e.g., emit light periodically, rather than continuously, or at less frequent time intervals) to prolong operation of the tamper-detection sensor 64 of the meter 20 in such circumstances. Thus, the meter 20 may have a normal tamper detection mode in which the emitter 60 emits light at a first frequency and the meter 20 may have a low power tamper detection mode (e.g., when powered by solar power and/or the battery/super capacitor 34) in which the emitter 60 emits light at a second frequency, less than the first frequency.

Figure 8:
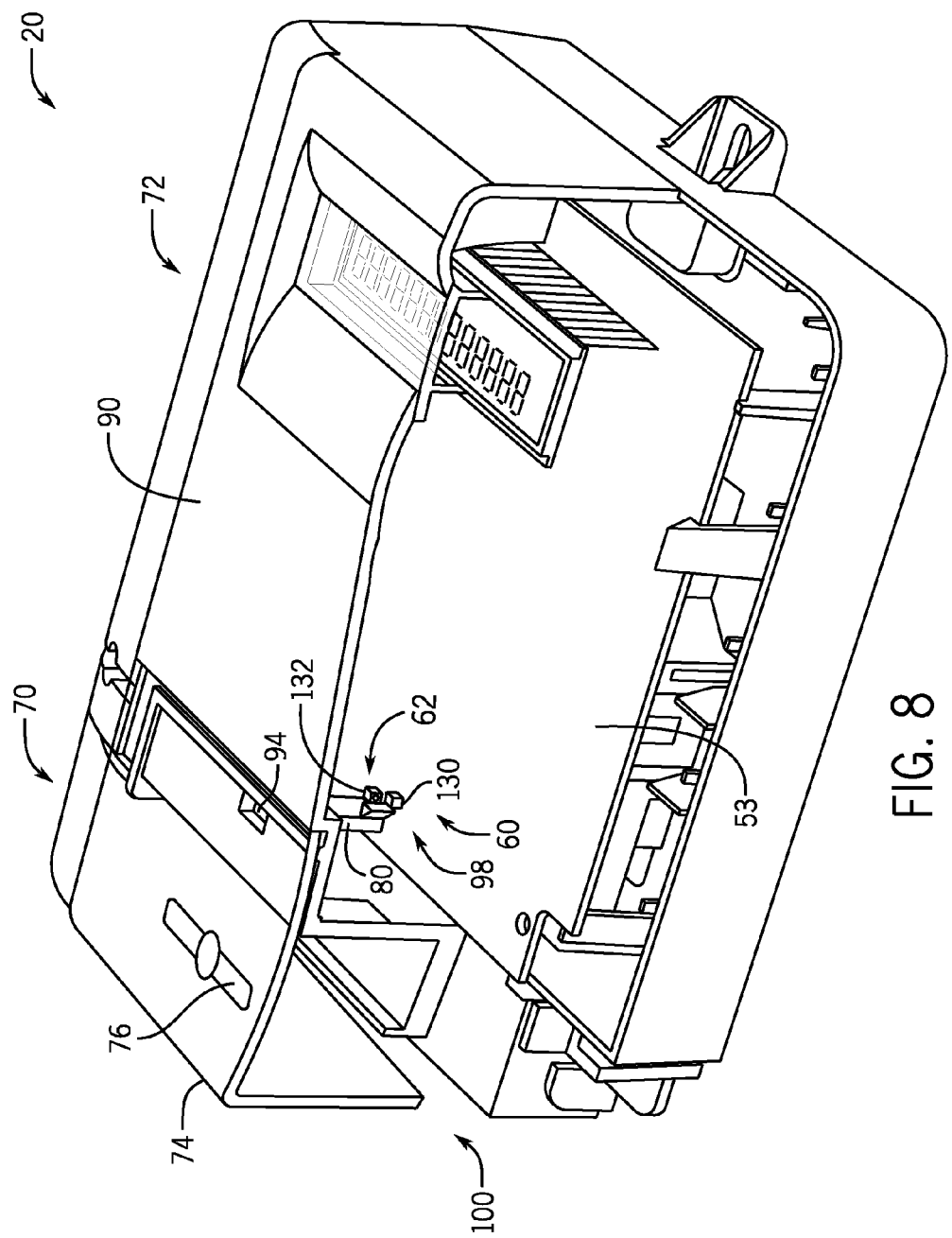
FIG. 8 is a perspective view of an embodiment of an energy meter including optical components and a cover having a light modifying feature configured to alter an orientation of light by 90 degrees to facilitate detection of tampering events.

FIG. 8 is a partial cutaway perspective view of an embodiment of the meter 20 having optical components and the light modifying feature 80 that is configured to alter an orientation of light by 90 degrees to detect tampering events. As shown, the emitter 60 and the detector 62 may be positioned in a crosswise configuration, such as perpendicular to one another, and may be coupled to the circuit board 53, or otherwise coupled to the main body 72 of the meter 20, in spaced-apart relation. In some such embodiments, the emitter 60 may be disposed within a first housing 130 and the detector 62 may be disposed within a second housing 132. As discussed above with respect to FIGS. 3-6, the light modifying feature 80 may extend from the interior surface 82 of the top wall 74 of the cover 70, and the end portion 98 may be positioned proximate (e.g., near or adjacent) to the emitter 60 and the detector 62 while the cover 70 is in the closed position 100. As noted above, the light modifying feature 80 may have any suitable cross-sectional area. As shown, the light modifying feature 80 may have a rectangular cross-sectional shape along a portion of its length 96 (FIG. 4) and a triangular cross-sectional shape at the end portion 98. Although in other embodiments, the light modifying feature 80 may have a generally uniform triangular or rectangular cross-section along its length 96. Regardless of the cross-sectional shape of the light modifying feature 80, the cover 70 and the main body, via the opening 94 for example, may be configured to align the light modifying feature 80 with the emitter 60 and the detector 62. Thus, the emitter 60 and the detector 62 are disposed in a crosswise configuration, and relative to the light modifying feature 80, in a configuration that enables the emitter 60 to emit light toward the light modifying feature 80 and that enables the detector 62 to detect the light reflected from the light modifying feature 80.

Figure 9:
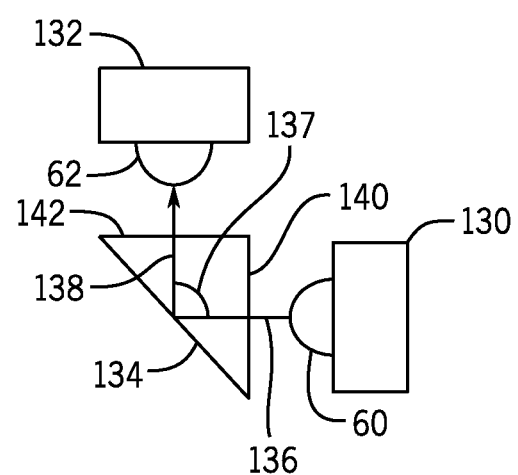
FIG. 9 is a schematic top view of a portion of the energy meter of FIG. 8 with the cover in a closed position and the light modifying feature positioned proximate to the optical components.

FIG. 9 is a schematic top view of a portion of the meter 20 of FIG. 8 with the cover 70 in the closed position 100. As shown, the light modifying feature 80 is a prism having one reflective face 134 at an angle relative to both the emitter 60 and the detector 62. The emitter 60 is configured to emit light along a first path 136 toward the light modifying feature 80. The reflective face 134 reflects the light by an angle 137, which is about 90 degrees in the illustrated embodiment, and the reflected light travels toward the detector 62 along a second path 138. The light modifying feature 80 may have a triangular horizontal cross-section (e.g., a right triangular horizontal cross-section). A first wall 140 and a second wall 142 may be positioned orthogonally with respect to each other and with respect to the first path 136 and the second path 138, respectively, such that the light is not dispersed or altered by passing through the walls 140, 142. In the depicted configuration, the emitter 60 and the detector 62 are positioned in a crosswise configuration (e.g., angled relative to one another). It should be understood that the emitter 60 and the detector 62 may be positioned at any suitable angle relative to one another, such as about 90 degrees, 60-120 degrees, 70-110 degrees, or 80-100 degrees. Additionally, the emitter 60, the detector 62, and the light modifying feature 80 are positioned to facilitate detection of the emitted light at the detector 62 while the cover 100 is in the closed position.

As discussed above with respect to FIG. 7, if the cover 70 is not in the closed position 100 (e.g., the cover 70 is removed from the meter 20), the light modifying feature 80 is not positioned proximate to the emitter 60 and the detector 62. While the cover 70 is not in the closed position 100, light emitted by the emitter 60 is not reflected by the reflective face 134 toward the detector 62. The processor 46 may be configured to determine that the cover 70 has been removed from the meter 20 and that a tampering event has occurred based whether light is received at the detector 62. As noted above, when the tampering event is detected, the processor 46 may record the tampering event and/or may communicate the tampering event to a utility provider, as discussed above. Other control actions, such as locking the meter 20, termination service, or the like, may be taken.

Although the light modifying feature 80 shown in FIGS. 8 and 9 is configured to alter the orientation of light by 90 degrees, it should be understood that the light modifying feature 80 may be configured to alter the orientation of light in any suitable manner or by any suitable degree. For example, the light modifying feature 80 may alter the orientation of light by approximately 10-170 degrees, approximately 20-150 degrees, approximately 50-125 degrees, approximately 75-100 degrees, or any other suitable angle 137, such as about 45, 60, 75, 80, 105, 120, 135, 150, 165, or 180 degrees. In such cases, the emitter 60, the detector 62, and the light modifying feature 80 are disposed relative to one another to facilitate reflection and subsequent detection of the emitted light at the detector 62 while the cover is in the closed position 100.

Figure 10:
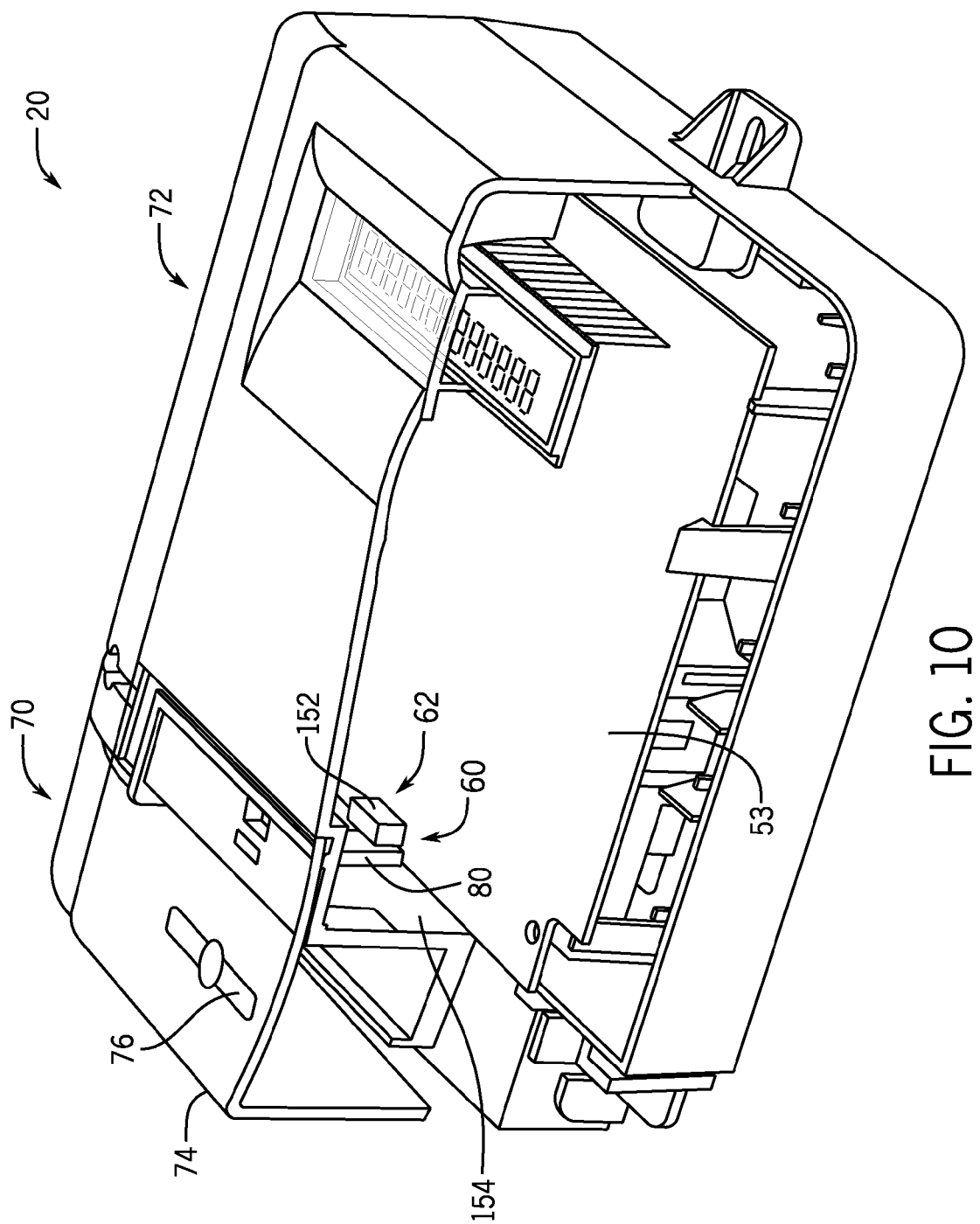
FIG. 10 is a perspective view of an embodiment of an energy meter including optical components and a cover having a light modifying feature configured to focus light to facilitate detection of tampering events.

FIG. 10 is a partial cutaway perspective view of an embodiment of the meter 20 having optical components and the cover 70 having the light modifying feature 80 configured to focus light to facilitate detection of tampering events. The light modifying feature 80 may have any suitable form for focusing light, such as a lens. Additionally, the light modifying feature 80 may be configured to enable light to pass through the light modifying feature 80 in one or more directions (e.g., may transmit or transfer light). As shown, the emitter 60 and the detector 62 may be positioned adjacent to one another and may be coupled to the circuit board 53. In some embodiments, the emitter 60 and the detector 62 are disposed within a housing 152 that is coupled to the circuit board 53. As discussed above with respect to FIG. 3, the light modifying feature 80 may extend from the interior surface 82 of the top wall 74 of the cover 70. The light modifying feature 80 may be positioned between any suitable light reflective portion of the meter 20, such as a side wall 154 of the meter 20, and one or both of the emitter 60 and the detector 62. The side wall 154 may be opaque or may be otherwise configured to reflect light. The emitter 60, the detector 62, the light modifying feature 80, and the side wall 154 are disposed in a configuration that enables the emitter 60 to emit light through the light modifying feature 80 toward the side wall 154 and that enables the detector 62 to detect the light reflected by the side wall 154 and focused by the light modifying feature 80, as discussed in more detail below.

Figure 11:
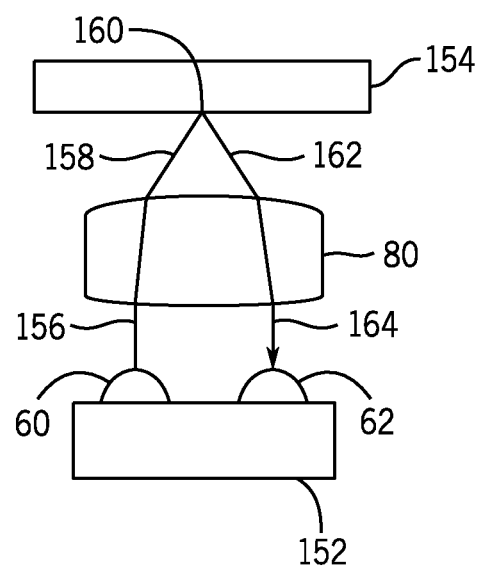
FIG. 11 is a schematic top view of a portion of the energy meter of FIG. 10 with the cover in a closed position and the light modifying feature positioned proximate to the optical components.

FIG. 11 is a schematic top view of a portion of the meter 20 of FIG. 10 with the cover 70 is in the closed position 100. As shown, the emitter 60 and the detector 62 are positioned in a side-by-side configuration. The light emitted by the emitter 62 travels along a first path 156 toward the light modifying feature 80. The light modifying feature 80 may alter (e.g., focus) the direction or orientation of the light as the light passes through the light modifying feature 80. The light modifying feature 80 may direct the light along a second path 158 toward a location 160 (e.g., a light-reflective area) of the side wall 154. The light may be reflected by the side wall 154 and may travel along a third path 162 toward the light reflecting feature 80. The light reflecting feature 80 may again alter the direction or orientation of the light and may direct the light along a fourth path 164 toward the detector 62. Thus, the emitter 60, the detector 62, the light modifying feature 80, and/or the side wall 54 are positioned to facilitate detection of the emitted light at the detector 62 while the cover 100 is in the closed position.

As discussed above with respect to FIGS. 7 and 9, if the cover 70 is not in the closed position 100 (e.g., the cover 70 is removed from the meter 20), the light modifying feature 80 is not positioned proximate to the emitter 60 and the detector 62. Thus, if the cover 70 is not in the closed position 100, light emitted by the emitter 60 is not focused or otherwise altered by the light modifying feature 80 to reach the detector 62. The processor 46 may be configured to determine that the cover 70 has been removed from the meter 20 and that a tampering event has occurred based on whether light is received at the detector 62. As noted above, when the tampering event is detected, the processor 46 may record the tampering event and/or may communicate the tampering event to a utility provider, as discussed above.

Figure 12:
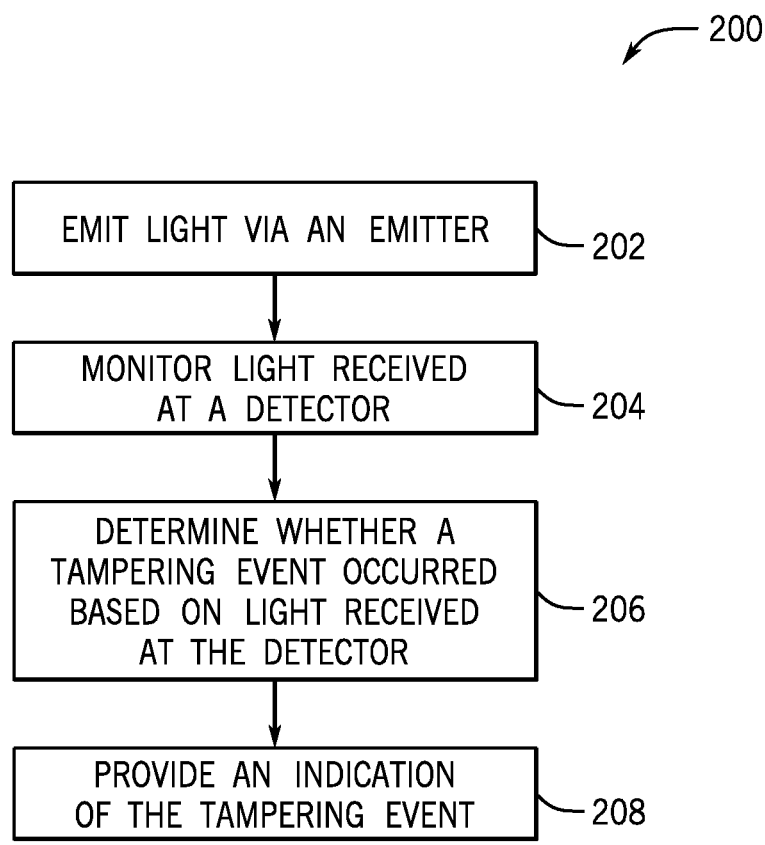
FIG. 12 is a process flow diagram of an embodiment of a method for detecting a tampering event.

FIG. 12 is a process flow diagram illustrating an embodiment of a method for detecting a tampering event in a utility meter, e.g., meter 20. Specifically, FIG. 12 depicts an embodiment of a method 200 of operation of the meter 20. The method 200 may be a computer-implemented method, and each step of the method 200 may be carried out based on code or instructions stored in a non-transitory machine-readable medium (e.g., the non-volatile storage 50 or the memory 48) and executed, for example, by the one or more processors 46, for example. The method 200 may begin with emitting light via the emitter 60 (block 202). As noted above, the light may be of any suitable wavelength and may be emitted continuously or at predetermined intervals.

The processor 46 may monitor whether the light is received at the detector 62 (block 204). For example, when light is received at the detector 62, the detector 62 may generate a signal that is transmitted to the processor 46. However, if no light is received at the detector 62, the detector 62 does not transmit the signal to the processor 46. In some cases, an intensity of the light received at the detector 62 may be monitored based on an intensity of the signal generated by the detector 62, for example. The processor 46 may determine whether a tampering event has occurred based on the light received at the detector 62 (block 206). The processor 46 may determine that the tampering event has occurred if no light is received at the detector 62, or if light corresponding to the wavelengths of light emitted by the emitter 60 is not received at the detector 62, for example. In some cases, the processor 46 may determine that the tampering event has occurred if the intensity of the light received at the detector 62 is below a predetermined threshold.

When the tampering event is detected, the processor 46 may provide an indication that the tampering event has occurred (block 208). The acts represented by block 208 may include, by way of non-limiting examples, recording (e.g., storing) data relating to the cover removal (e.g., a date and/or time of the removal), communicating with the utility provider 12 that a tampering event has occurred, providing a visual indication of the tampering event via the display 44, triggering an alarm (e.g., a visual or audible alarm) at the meter 20 or other suitable location, or any combination thereof. The processor 46 may instruct the communication links 22 of the meter 20 to communicate with one or more external devices, such as external metering infrastructure, cellular telephones, personal computers, or similar devices, to name a few. Specifically, one or more indications that the meter 20 has detected a tampering event may be communicated to any one or a combination of these devices. The indications may include identifying information of the consumer and/or the meter 20, a time and/or date in which the potential tampering occurred, or any combination thereof. Further, in certain situations, the processor 46 may cause the display 44 to provide a brief (e.g., a few seconds) visual indication that a potential tampering situation has been detected. In some embodiments, the display 44 may be locked into this indication, for example, until a technician or similar authorized person resets the meter 20 to normal operation. By way of a non-limiting example, in one embodiment, the display 44 may indicate "COVER REMOVAL DETECTED," or "TAMPER DETECTED," and, additionally or alternatively, may provide an indication of the date and/or time of the tampering event. Further, in some embodiments, the meter 20 may block other operation of the meter 20 or use of the metered utility until the tamper indication has been cleared from the meter 20, for example by resetting the meter 20 using an authorized code and/or authorized hardware. In some embodiments, the utility service may be stopped until the tamper indication has been cleared from the meter 20, for example.

Technical effects of the presently disclosed embodiments include systems and methods to detect tampering events of utility meters. Particularly, a utility meter may be configured to detect removal of the cover using one or more optical components and a light modifying feature, and detection of cover removal may in turn be utilized to identify tampering events. The tamper detection systems disclosed herein may also be configured to initiate a suitable response or control action, such as providing an indication of the tampering event, locking the meter, or the like.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A utility meter, comprising:
   a main body supporting:
   metering circuitry configured to monitor consumption of a utility;
   an emitter configured to emit one or more wavelengths of light; and
   a detector positioned crosswise from and generally perpendicular to the emitter, the detector configured to receive the emitted light and to generate a signal indicative of the emitted light received at the detector;
   a meter cover removably attached to the main body and movable from a closed position to an open position relative to the main body, the meter cover including a light modifying feature in communication with a reflective surface, the light modifying feature coupled to an interior surface of the meter cover and configured to alter an orientation of the emitted light by approximately 90 degrees from the reflective surface and direct the emitted light toward the detector when the meter cover is in its closed position and as the meter cover is moved from its closed position to an open position; and a processor communicatively coupled to the emitter and the detector and configured to determine whether the meter cover is in its closed position or in an open position based on the signal generated by the detector, the processor determining the meter cover is in its closed position when the processor receives a signal generated by the detector and that the meter cover is in an open position when the processor does not receive said signal.

2. The utility meter of claim 1, wherein the light modifying feature comprises a prism.

3. The utility meter of claim 2, wherein the emitter and the detector are offset from one another, the emitter is configured to emit light in a first direction along a first pathway, and the detector is configured to receive light traveling in a second direction along a second pathway that is angled relative to the first pathway.

4. The utility meter of claim 1, wherein the light modifying feature comprises a lens configured to be positioned between the reflective surface of the utility meter and both of the emitter and the detector while the cover is in the closed position, and to focus the emitted light toward a location on the reflective surface of the utility meter.

5. The utility meter of claim 4, wherein the reflective surface is configured to reflect the light toward the lens, and the lens is configured to direct the light reflected from the reflective surface toward the detector.

6. The utility meter of claim 1, wherein the light modifying feature and meter cover are integrally formed from a single, homogenous, and transparent material.

7. The utility meter of claim 1, wherein the emitter is configured to emit infrared light.

8. A tamper detection system for a utility meter having a main body and a cover removably attached to the main body and movable from a closed position to an open position, the tamper detection system comprising:

an emitter configured to emit one or more wavelengths of light;

a detector positioned crosswise from and generally perpendicular to the emitter and configured to receive the emitted light;

a light modifying feature formed on the meter cover and in communication with a reflective surface and configured to direct the emitted light along a path forming approximately a 90 degree angle from the emitter to the reflective surface and ultimately to the detector while the meter cover is in its closed position relative to the utility meter and during movement of the meter cover from its closed position to an open position; and a processor communicatively coupled to the emitter and the detector configured to determine whether the meter cover is in the closed position or in an open position based on the signal generated by the detector, the processor determining when the meter cover is in its closed position by receiving a signal generated by the detector and when the meter cover is in an open position when the processor does not receive said signal.

9. The system of claim 8, wherein the light modifying feature is transparent.

10. The system of claim 9, wherein the meter cover and the light modifying feature are integrally formed from a single, homogenous material.

11. The system of claim 8, wherein the reflective surface is angled relative to both the emitter and the detector along the path of light when the meter cover is in the closed position.

12. The system of claim 8, wherein the light modifying feature comprises a lens configured to be positioned between a reflective surface of the utility meter and both of the emitter and the detector while the meter cover is in the closed position.

13. A method for detecting tampering of a utility meter having a main body and a cover removably attached to the main body and movable from a closed position to an open position, comprising:

emitting one or more wavelengths of light via an emitter coupled to the utility meter;

altering an orientation of the light emitted by the emitter approximately 90 degrees to direct the light toward a detector positioned crosswise from and generally perpendicular to the emitter and coupled to the utility meter via a light modifying feature formed on the meter cover and in communication with a reflective surface and coupled to the meter cover when the cover is in its closed position relative to the utility meter and as the meter cover moves from its closed position to an open position;

monitoring an intensity of the light received at the detector using a processor of the utility meter, the processor being communicatively coupled to the emitter and the detector;

comparing the intensity of the light received at the detector by way of the reflective surface to a predetermined threshold intensity, using the processor of the utility meter; and identifying a tampering event of the utility meter when the intensity of the light received at the detector is below the predetermined threshold intensity, using the processor of the utility meter or using a separate processing unit.

14. The method of claim 13, wherein infrared light is emitted by way of the emitter.

15. The method of claim 13, comprising storing information related to the tampering event at a memory of the utility meter or providing an indication of the tampering event to a remote utility provider via a communication link.

* * * * *